US012785042B2

(12) United States Patent
Nordmann

(10) Patent No.: US 12,785,042 B2
(45) Date of Patent: Nov. 3, 2026

(54) IMPEDANCE MATCHING MODULE, IMPEDANCE MATCHING CIRCUIT, PLASMA PROCESS SUPPLY SYSTEM AND PLASMA PROCESS SYSTEM

(71) Applicant: TRUMPF Hüttinger GmbH + Co. KG, Freiburg (DE)

(72) Inventor: Birger Nordmann, Herdecke (DE)

(73) Assignee: TRUMPF Hüttinger GmbH + Co. KG, Freiburg (DE)

( * ) Notice: Subject to any disclaimer, the term of this patent is extended or adjusted under 35 U.S.C. 154(b) by 0 days.

(21) Appl. No.: 19/310,998

(22) Filed: Aug. 27, 2025

(65) Prior Publication Data

US 2025/0379035 A1 Dec. 11, 2025

Related U.S. Application Data

(63) Continuation of application No. PCT/EP2024/054981, filed on Feb. 27, 2024.

(30) Foreign Application Priority Data

Feb. 28, 2023 (DE) ..................... 10 2023 104 960.7

(51) Int. Cl.
*H01J 37/32* (2006.01)
*H10W 40/25* (2026.01)

(52) U.S. Cl.
CPC ..... *H01J 37/32183* (2013.01); *H10W 40/255* (2026.01)

(58) Field of Classification Search
CPC ........................ H01J 37/32183; H10W 40/255
See application file for complete search history.

(56) References Cited

U.S. PATENT DOCUMENTS 5,654,679 A 8/1997 Mavretic et al.
10,679,823 B2 6/2020 Mavretic et al.
(Continued)

FOREIGN PATENT DOCUMENTS

DE 69707129 T2 7/2002
DE 102013215645 A1 2/2015
(Continued)

*Primary Examiner* — Alexander H Taningco
*Assistant Examiner* — Pedro C Fernandez
(74) *Attorney, Agent, or Firm* — Leydig, Voit & Mayer, Ltd.

(57) ABSTRACT

An impedance matching module for an impedance matching circuit, including an insulating circuit board, planar conductor tracks arranged on a top and bottom side of the insulating circuit board, a plurality of semiconductor switching elements, and a substrate. The planar conductor tracks are configured to connect connections of the semiconductor switching elements to one another and to other components. The semiconductor switching elements are arranged on the top side and configured to connect and disconnect reactances to change an impedance. The substrate is thicker than the insulating circuit board and connected over a majority of the bottom side. The substrate is configured such that the planar conductor tracks can be spaced apart and insulated from the cooling body. The substrate and a connection of the circuit board to the substrate are configured to dissipate heat of the planar conductor tracks and semiconductor switching elements to the cooling body.

15 Claims, 3 Drawing Sheets

(56) References Cited

U.S. PATENT DOCUMENTS

| | | | | |
|---|---|---|---|---|
| 12,341,478 | B2 | 6/2025 | Nordmann | |
| 2003/0032396 | A1 | 2/2003 | Tsuchiya et al. | |
| 2009/0026968 | A1 * | 1/2009 | Kirchmeier | H01J 37/32045 219/121.36 |
| 2020/0169230 | A1 * | 5/2020 | Gruner | H01J 37/32183 |
| 2022/0285173 | A1 * | 9/2022 | Schmidt | H10W 70/09 |
| 2023/0043171 | A1 * | 2/2023 | Nordmann | H03F 3/19 |
| 2023/0216467 | A1 * | 7/2023 | Nordmann | H03H 7/1775 333/174 |

FOREIGN PATENT DOCUMENTS

| | | | |
|---|---|---|---|
| DE | 202020102084 | U1 | 5/2020 |
| DE | 202020103539 | U1 | 6/2020 |
| DE | 102023104942 | A1 | 8/2024 |
| DE | 102023104948 | A1 | 8/2024 |
| DE | 102023104955 | A1 | 8/2024 |
| DE | 102023104958 | A1 | 8/2024 |
| JP | 2003051751 | A | 2/2003 |
| KR | 102047245 | B1 | 11/2019 |
| WO | WO 2009012735 | A1 | 1/2009 |
| WO | WO 2022223674 | A2 | 10/2022 |
| WO | WO 2022251269 | A2 | 12/2022 |

* cited by examiner

IMPEDANCE MATCHING MODULE, IMPEDANCE MATCHING CIRCUIT, PLASMA PROCESS SUPPLY SYSTEM AND PLASMA PROCESS SYSTEM

CROSS REFERENCE TO RELATED APPLICATIONS

This application is a continuation of International Application No. PCT/EP2024/054981 (WO 2024/180077 A1), filed on Feb. 27, 2024, and claims benefit to German Patent Application No. DE 10 2023 104 960.7, filed on Feb. 28, 2023. The aforementioned applications are hereby incorporated by reference herein.

FIELD

The present invention relates to an impedance matching module, an impedance matching circuit, a plasma process supply system and a plasma process system.

BACKGROUND

Such an impedance matching module can be used in an impedance matching circuit in a system in which a load is supplied with electrical power, in particular high-frequency power. 'High frequency' is also abbreviated to 'HF' in the following. HF here refers to frequencies in the range from 2 MHz to 100 MHz, in particular in the range from 10 MHz to 50 MHz.

In such a system, the impedance of the load should be matched to the impedance of the power supply, as otherwise power reflection can occur. The power reflection has a direct impact on the efficiency of a system; it reduces the effectiveness of a system.

An exemplary system in which an impedance matching circuit can be used can be a plasma process system.

Such a plasma process system can, for example, be a system in which a load, e.g., a plasma process assembly, is supplied with electrical power.

Such a plasma process assembly can, for example, be a plasma process chamber used for industrial plasma processes such as the surface treatment of workpieces, semiconductor manufacturing with plasma, or the processing of workpieces with gas lasers.

In such an application, the plasma process assembly serves to generate plasma.

For this purpose, a plasma process assembly may have an electrode which is fed with a high-frequency power signal for generating the plasma, hereinafter referred to as the HF power signal.

Typically, a high-power and in particular high-voltage power supply is required, for which the plasma process assembly can be connected to a high-frequency power supply, hereinafter referred to as HF power supply.

The plasma process taking place in the plasma process assembly has the problem that the electrical load impedance of the plasma process assembly, which occurs during the process, depends on the conditions in the plasma process assembly and can vary greatly. In particular, the properties of the workpiece, electrodes, and gas conditions are taken into account.

For this reason, an impedance matching circuit is usually required to transform the impedance of the load to a nominal impedance of the HF power supply. Such an impedance matching circuit is usually placed between an HF power supply and the plasma process assembly, usually in the immediate vicinity of the plasma process assembly.

An impedance matching circuit is usually an assembly that may have inductors and/or capacitors.

For complex problems where it is important to be able to change the impedance quickly, semiconductor-switched impedance matching circuits are often used. These semiconductor switching elements can be used to connect and disconnect inductors and/or capacitors in impedance matching circuits. Control circuits can be used to control the connecting and disconnecting of the semiconductor switching elements. An example of such a semiconductor-switched impedance matching circuit is disclosed and described in DE 20 2020 102 084 U1. With ever-increasing performance requirements in this area, the circuits in which the actual semiconductor switching elements are arranged are becoming increasingly complex. These complex circuits are usually intended to implement universal switching elements that function in both parallel and series configurations. DE 20 2020 103 539 U1 discloses and describes with FIG. 3 an example of such a more complex circuit, referred to there as a switchable reactance unit. This circuit contains semiconductor switching elements in both parallel and series configurations.

Particularly in series configurations, parasitic capacitances arise due to the necessary cooling of the semiconductor switching elements. These parasitic capacitances have a negative impact on the electrical performance of such a circuit.

A compact design, i.e., one that is designed to save as much space as possible, is very desirable.

SUMMARY

In an embodiment, the present disclosure provides an impedance matching module for an impedance matching circuit, a plasma process supply system, and a plasma process system for mounting on a metallic, cooling body, configured for powers ≥500 W and frequencies in the range from 2 MHz to 100 MHz, comprising an insulating circuit board, planar conductor tracks arranged on a top side and a bottom side of the insulating circuit board, a plurality of semiconductor switching elements including transistors or PIN diodes, and a substrate including a ceramic plate. The planar conductor tracks are configured to connect connections of the semiconductor switching elements to one another and to other components. The semiconductor switching elements are arranged on the top side of the insulating circuit board and are configured to connect and disconnect reactances, e.g., capacitors and/or coils, to change an impedance from an input to an output of the impedance matching circuit. The substrate is thicker than the insulating circuit board and is fixedly connected to a surface of the insulating circuit board over a majority of the bottom side of the insulating circuit board. The substrate is configured such that the planar conductor tracks can be spaced apart, by the substrate, from the cooling body to be electrically insulated from the cooling body. The substrate and a connection of the circuit board to the substrate are configured to dissipate heat of the planar conductor tracks and semiconductor switching elements to the cooling body.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
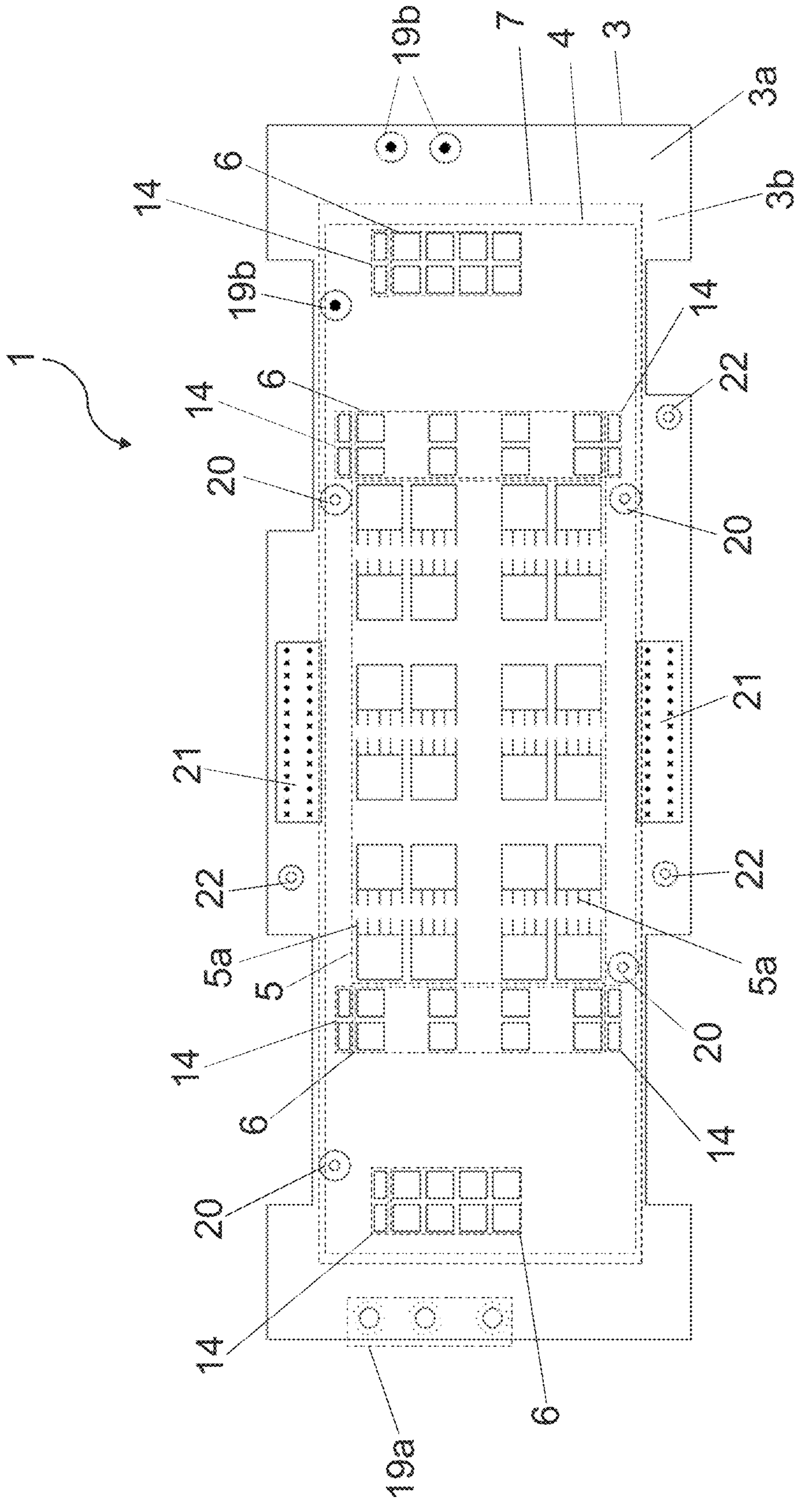
FIG. 1 illustrates a plan view of an embodiment of a top side of an insulating circuit board of an impedance matching module according to the present disclosure.

In an embodiment, the present disclosure provides an impedance matching module for powers ≥500 W and frequencies in the range from 2 to 100 MHz, which allows complex structures for the arrangement of semiconductor switching elements in parallel and series configuration in a compact design and can be realized with high-performance cooling and reduced parasitic capacitance.

According to the present disclosure, an impedance matching module for an impedance matching circuit, a plasma process supply system, and a plasma process system for mounting on an, in particular metallic, cooling body, designed for powers ≥500 W and frequencies in the range from 2 MHz to 100 MHz are proposed, having:

a) an insulating circuit board, b) planar conductor tracks arranged on a top side and/or a bottom side of the insulating circuit board, c) a plurality of semiconductor switching elements, in particular transistors or PIN diodes, d) a substrate, in particular a ceramic plate, e) wherein the planar conductor tracks are designed to connect the semiconductor switching element connections to one another and to other components, f) wherein the semiconductor switching elements are arranged on the top side of the insulating circuit board and are designed to connect and disconnect reactances, e.g., capacitors and/or coils, to change an impedance from the input to the output of an impedance matching circuit, g) wherein the substrate is thicker than the insulating circuit board and is fixedly connected to the surface of the insulating circuit board over the majority of the bottom side of the circuit board, and h) wherein the substrate is designed such that the planar conductor tracks can be spaced apart from a cooling body, in particular a metallic cooling body, by this substrate to be electrically insulated therefrom, and i) wherein the substrate and the connection of the circuit board to the substrate are configured to dissipate the heat of the planar conductor tracks and semiconductor switching elements to a cooling body.

By constructing an insulating, thermally conductive substrate combined with an insulating circuit board on which a complex layout of planar conductor tracks can be structured, whereon components can be arranged, the problem of a complex circuit, high-performance cooling and minimal parasitic capacitance can be solved.

For example, a plate made of aluminum oxide or aluminum nitride ceramic can be used for the substrate. The insulating circuit board can comprise conventional circuit board material, e.g., FR-4, or in particular polytetrafluoroethylene-based material, also called PTFE material. This material is particularly suitable due to the low dielectric constant and low losses thereof.

The designation FR-4 stands for a class of flame-retardant and flame-resistant composite materials consisting of epoxy resin and glass fiber fabric. The abbreviation FR stands for flame retardant.

Polytetrafluoroethylene-based material, also abbreviated as PTFE material, is many times more expensive than FR-4, but it can be used for circuit boards in the HF range because it has particularly low losses in this frequency range. The circuit boards can be designed to be thinner because this material has a lower dielectric constant and also a higher dielectric strength against high electric fields.

"Fixedly connected" means a connection between the circuit board and the substrate that cannot slip during operation, cannot come loose, and in which no air pockets can be present or form. Such air pockets often occur in components connected with thermal conductive paste. These have the disadvantage that high electric fields can arise at the edge of the air inclusions, which in turn can lead to harmful partial discharges. In addition, the thermal conductivity is negatively affected. The 'fixed connection' is advantageously produced by pressing and/or gluing, in particular under pressure combined with heat.

A "majority" means a proportion of the area that makes up at least 60%, in particular at least 80%, of the total area. For example, if the bottom side of the circuit board is 100 $cm^2$, the "majority of the bottom side" should be at least 60 $cm^2$, in particular at least 80 $cm^2$.

The planar conductor tracks are made of an electrically conductive material, in particular copper. An arrangement of the conductor tracks on the top side and bottom side of the insulating circuit board enables a very flexible and complex layout. In some places, the conductor tracks on the top side and bottom side can be electrically connected by vias. The top side of the insulating circuit board can be covered with another coating.

Metal oxide semiconductor field effect transistors (MOSFETs), for example, can be used for the semiconductor switching elements. The semiconductor switching elements can be attached, for example, by soldering them onto the planar conductor tracks on the top side of the insulating circuit board.

In addition to the semiconductor switching elements, reactances such as coils and/or capacitors can also be arranged on the top side of the insulating circuit board, which are designed to be connected and disconnected by the semiconductor switching elements. By arranging the reactances directly on the insulating circuit board, the heat thereof can also be dissipated via the substrate.

Furthermore, resistors can be arranged on the top side of the insulating circuit board, which are designed to prevent overloading of individual semiconductor switching elements. This makes the entire arrangement more robust and even in the event of a fault, the expensive semiconductor switching elements can remain undamaged. By arranging the resistors directly on the insulating circuit board, the heat thereof can also be dissipated via the substrate.

Furthermore, circuit board connection options can be arranged on the top side of the insulating circuit board, via which a plurality of further circuit boards can be connected and, in particular, stacked over the first circuit board. The circuit board connection options can be either electrical circuit board connection options that electrically connect the individual circuit boards to one another or mechanical circuit board connection options that secure the circuit boards and ensure a distance between the circuit boards. The added further circuit boards can have further reactances, referred to here as additional reactances, such as capacitors and/or coils, which can be connected and disconnected via the semiconductor switching elements. The added further circuit boards can have conventional circuit board material such as FR-4 or polytetrafluoroethylene-based material. The ability to add further circuit boards with additional reactances makes the impedance matching module modularly expandable and thus more scalable.

Furthermore, the insulating circuit board and the substrate of the impedance matching module can be connected by heating and pressing together a prepreg inserted therebetween. "Prepreg" is a common material name, which is an abbreviation of pre-impregnated. This usually refers to pre-impregnated, mostly planar, flat textile semi-finished products with a thermoplastic or thermosetting matrix, such as unidirectional layers of threads, fabrics or scrims with threads often arranged at right angles.

Prepregs are cured under temperature and pressure to produce components. For example, they are prefabricated in web form, wound on rolls. The term prepreg includes not only unidirectionally reinforced or flat semi-finished products, but also other preforms of basically any shape, which in the broadest sense consist of a fiber-filled, uncured thermosetting matrix. The matrix is in a partially cross-linked state and is pasty to solid, but can be re-liquefied by heating.

Prepregs are machine-processable and are therefore often used in automated processes. They produce consistent and high quality. Advantages are the low undulation and high fiber volume content thereof. Curing at high temperatures enables short cycle times in further processing. Processing requires high investment costs, e.g., for autoclaves, laying robots, and refrigerated storage. Such prepregs are generally used to join several circuit boards together to form a multilayer circuit board. To ensure a secure and long-lasting joint, the materials to be joined should have very similar properties regarding the expansion thereof when heated. However, this is not necessarily the case with the circuit board and the substrate, especially if the substrate is made of ceramic. This initially spoke against such a connection. However, ceramics have very good thermal conductivity and at the same time very good electrical insulating properties and also low dielectric losses when isolating high-frequency signals of high voltage. Contrary to expectations, tests have shown that even with small dimensions, a secure and long-lasting joining of materials can be provided with different properties, such as ceramic with FR-4 and/or ceramic with PTFE material. "Small dimensions" means a composite area of less than 400 $cm^2$ and/or with a maximum length of 20 cm.

The entire impedance matching component can be applied via the substrate to a cooling body, which dissipates the heat from the planar inductors. Such a cooling body can preferably be metallic, in particular made of aluminum and/or copper. The cooling body can further be a fluid cooling body having at least one cooling channel through which a fluid flows, via which the heat is dissipated. A thermal conductive paste can be applied between the cooling body and the substrate, and the impedance matching component can be attached to the cooling body using brackets.

Furthermore, the impedance matching module can be used in an impedance matching circuit in a plasma process supply system or a plasma process system.

Such a plasma process supply system can include an HF power supply in addition to the impedance matching circuit.

In addition to the impedance matching module, such an impedance matching circuit can also have further reactances, referred to here as additional impedances, such as coils and/or capacitors, as well as a control circuit. The additional reactances can be implemented as planar reactances and, like the existing reactances, can be connected and disconnected via the semiconductor switching elements. The connecting and disconnecting using the semiconductor switching elements can be controlled via the control circuit.

The entire impedance matching circuit can be connected to the HF power supply on the one hand and can be designed to be connected to a plasma process assembly on the other hand.

In a plasma process system, such a plasma process assembly can be present and connected to the impedance matching circuit. The plasma process assembly can be supplied with electrical power provided by the HF power supply via the impedance matching circuit.

Embodiments of the present disclosure are shown schematically in the drawings, and are explained in more detail below with reference to the figures.

FIG. 1 shows a plan view of a first embodiment of a top side of an insulating circuit board 3 of an impedance matching module 1 according to the present disclosure. Also indicated are the substrate 4, which is arranged under the circuit board 3, and the cooling body 7, which is arranged under the substrate 4, which is shown again in FIG. 2. The top side of the insulating circuit board 3 has semiconductor switching elements 5, reactances 6 in the form of capacitors, resistors 14, and various connection options 19*a*, 19*b*, 20, 21, 22. In this figure, the planar conductor tracks 2 (shown in FIG. 2) of the impedance matching component 1 are covered by a coating on the top side 3*a* of the insulating circuit board 3 or are applied to the bottom side 3*b* of the insulating circuit board 3. The connection options 19*a*, 19*b*, 20, 21, 22 are divided into signal connection options 19*a*, 19*b*, mechanical circuit board connection options 20, electrical circuit board connection options 21, and cooling body connection options 22. The signal connection options 19*a*, 19*b* can be further divided into integrated signal connection options 19*a*, which are integrated into the insulating circuit board 3, and into applied signal connection options 19*b*, which are applied to the insulating circuit board 3. The impedance matching module 1 can be supplied with HF power signals or control signals of the control circuit 18, for example, via the signal connection options 19*a*, 19*b*, and can be integrated into the entire impedance matching circuit 11.

Figure 2:
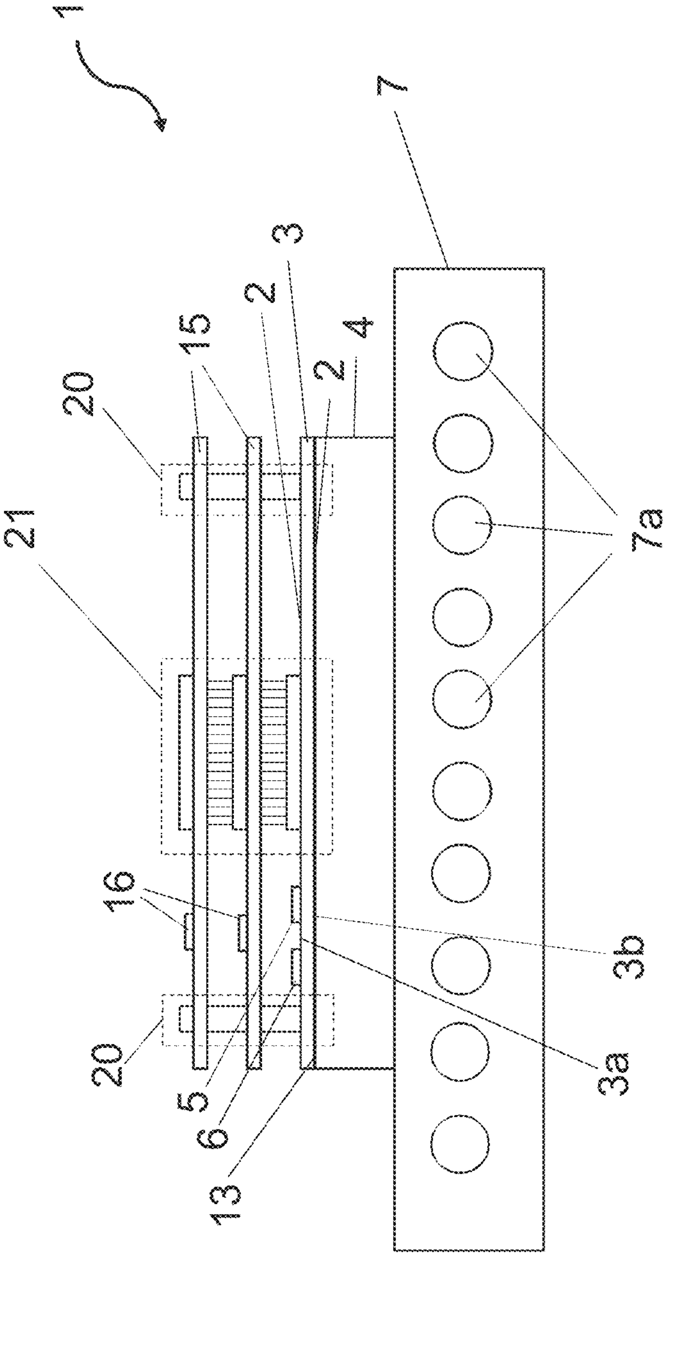
FIG. 2 illustrates a schematic view of an embodiment of an impedance matching module according to the present disclosure arranged on a cooling body in cross-section.

Additional circuit boards 15 can be attached to the insulating circuit board 3 spaced apart via the mechanical circuit board connection options 20 (shown in FIG. 2). The mechanical circuit board connection options 20 can be implemented as cylindrical attachments with a height corresponding to the desired spacing of the circuit boards on the insulating circuit board 3. These cylindrical attachments can have a threaded hole in the center thereof, through which the other circuit boards 15 can be fixed with screws.

With the electrical circuit board connection options 21, the individual circuit boards can be electrically connected to one another, so that additional reactances 16 on further circuit boards 15 can be integrated into the circuit on the insulating circuit board 3.

The impedance matching module 1 can be attached to a cooling body 7 via the cooling body connection options 22.

The mechanical circuit board connection options 20 and the cooling body connection options 21 can be connected to a ground potential if required.

In addition, the semiconductor switching elements 5 can have semiconductor switching element connections 5*a*. The semiconductor switching elements 5 can be contacted via these and connected to other semiconductor switching elements 5 and/or other components via the planar conductor tracks 2.

When using a MOSFET as the semiconductor switching element 5, the semiconductor switching element connections 5*a* can comprise, for example, a gate, a drain connection, and a source connection.

FIG. 2 shows a first embodiment of an impedance matching module 1 according to the present disclosure arranged on a cooling body 7. The insulating circuit board 3 and the substrate 4 of the impedance matching module 1 are also visible in the cross-section shown. The insulating circuit board 3 is arranged on the substrate 4 and fixedly connected thereto. The insulating circuit board 3 has planar conductor tracks 2 on the top side and bottom side 3*a*, 3*b* of the insulating circuit board 3. The planar conductor tracks 2 connect the semiconductor switching element connections 5*a* to one another and to other components, such as the reactances 6 and resistors 14. The substrate 4 is arranged on the cooling body 7 and connected thereto. Due to the thickness of the substrate, the insulating circuit board 3 is spaced apart from the cooling body 7 and is electrically insulated therefrom. Two further circuit boards 15 are stacked on the insulating circuit board 3. The other circuit boards can be connected to one another via several circuit board connection options 20, 21. On the one hand, there are mechanical circuit board connection options 20, which are used for the mechanical fastening and spacing apart of the individual circuit boards 3, 15. On the other hand, there are electrical circuit board connection options 21 through which the individual circuit boards are electrically connected to one another. A more detailed description of the connection options can be found in the description of FIG. 1. Additional reactances 16, such as capacitors and/or coils, can be arranged on the further circuit boards 15.

The cooling body 7 is shown as a fluid cooling body having a plurality of cooling channels 7*a* which are designed to be flowed through by a fluid, e.g., water, through which heat can be dissipated.

Figure 3:
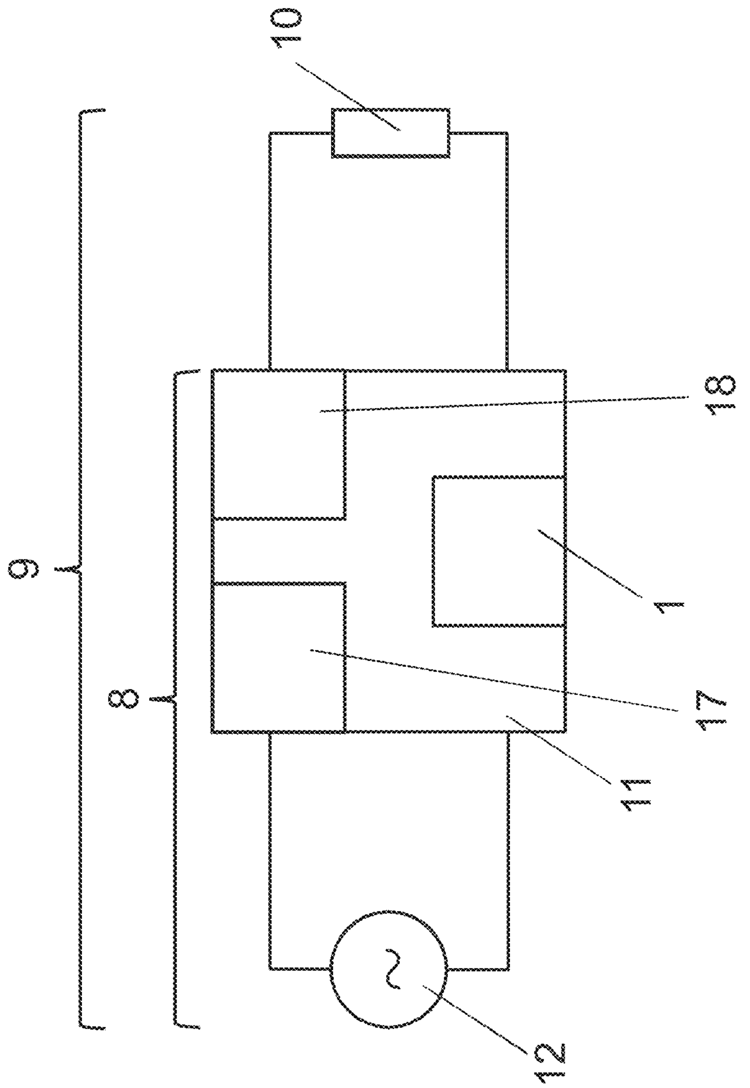
FIG. 3 illustrates a schematic view of an embodiment of a plasma process system.

FIG. 3 shows an embodiment of an exemplary plasma process system 9. The plasma process system 9 has a plasma process supply system 8 and a plasma process assembly 10. The plasma process supply system 8 comprises an impedance matching circuit 11 as previously described and an HF power supply 12. The impedance matching module 1 according to the present disclosure is integrated into the impedance matching circuit 11. In addition, the impedance matching circuit 11 comprises further additional reactances 17, such as capacitors and/or coils, as well as a control circuit 18.

Such a typical additional reactance 17 is described, for example, in patent application DE 10 2023 104 958.5 filed on Feb. 28, 2023, entitled "Impedance matching module, impedance matching circuit, plasma process supply system, and plasma process system," which is hereby fully incorporated by reference into the present application. In particular, the further impedance matching module (1) described in the said application can further develop the further additional reactances 17 with individual or all of the features thereof.

Such a typical impedance matching circuit 11 is described, for example, in patent application DE 10 2023 104 942.9 filed on Feb. 28, 2023, with the title "Impedance matching circuit, plasma process supply system and Plasma Process System," which is hereby fully incorporated by reference into the present application. In particular, the further impedance matching circuit (1) described in the said application can further develop the present impedance matching circuit 11 with individual or all of the features thereof.

Such a typical plasma process system 9 is for example in the patent application DE 10 2023 104 955.0 filed on Feb. 28, 2023 with the title "Impedance matching circuit for a plasma process system and a plasma process system with such an impedance matching circuit," which is hereby fully incorporated by reference into the present application. In particular, the second impedance matching unit (7) described in the said application can be designed with the features of the impedance matching module 1 described here.

Such a typical plasma process system 9 is described, for example, in patent application DE 10 2023 104 948.8 filed on Feb. 28, 2023, entitled "Impedance matching circuit, plasma process supply system and plasma process system," which is hereby fully incorporated by reference into the present application. In particular, the second impedance matching unit (7, 7*a*-7*f*) described in the said application can be designed with the features of the impedance matching module 1 described here.

With the features described above, the number of components, such as semiconductor switching elements or reactances, such as coils and/or capacitors as well as capacitances and/or inductances, can be kept lower, thus achieving an even more compact design.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An impedance matching module for an impedance matching circuit, a plasma process supply system, and a plasma process system for mounting on a metallic, cooling body, configured for powers ≥500 W and frequencies in the range from 2 MHz to 100 MHz, comprising:

a) an insulating circuit board;

b) planar conductor tracks arranged on a top side and a bottom side of the insulating circuit board;

c) a plurality of semiconductor switching elements including transistors or PIN diodes; and d) a substrate including a ceramic plate, e) wherein the planar conductor tracks are configured to connect connections of the semiconductor switching elements to one another and to other components, f) wherein the semiconductor switching elements are arranged on the top side of the insulating circuit board and are configured to connect and disconnect reactances, e.g., capacitors and/or coils, to change an impedance from an input to an output of the impedance matching circuit, g) wherein the substrate is thicker than the insulating circuit board and is fixedly connected to a surface of the insulating circuit board over a majority of the bottom side of the insulating circuit board, h) wherein the substrate is configured such that the planar conductor tracks can be spaced apart, by the substrate, from the cooling body to be electrically insulated from the cooling body, and i) wherein the substrate and a connection of the circuit board to the substrate are configured to dissipate heat of the planar conductor tracks and semiconductor switching elements to the cooling body.

2. The impedance matching module according to claim 1, wherein reactances, such as capacitors and/or coils, are arranged on the top side of the insulating circuit board and are configured to be switched on or off by the semiconductor switching elements.

3. The impedance matching module according to claim 1, wherein resistors are arranged on the top side of the insulating circuit board and are configured to prevent an overloading of individual semiconductor switching elements.

4. The impedance matching module according to claim 1, wherein on the top side of the insulating circuit board mechanical and electrical circuit board connections are provided, via which one or more further circuit boards are connected and stacked over the first insulating circuit board.

5. The impedance matching module according to claim 4, wherein the one or more further circuit boards have additional reactances, such as capacitors and/or coils, which are configured to be connected and disconnected by the semiconductor switching elements.

6. The impedance matching module according to claim 1, wherein the fixed connection of the insulating circuit board to the substrate is produced by pressing and/or gluing under pressure combined with heat.

7. The impedance matching module according to claim 1, wherein the substrate is connected to the insulating circuit board via a prepreg inserted therebetween by heating and pressing together.

8. The impedance matching module according to claim 1, wherein the impedance matching module is connected to the cooling body, which is a metallic cooling body, via the substrate.

9. The impedance matching module according to claim 8, wherein the cooling body is a fluid cooling body having at least one cooling channel through which a fluid flows, via which the heat is configured to be dissipated.

10. The impedance matching module according to claim 1, wherein the top side of the insulating circuit board is covered with a coating.

11. The impedance matching module according to claim 1, wherein the impedance matching module is modularly expandable.

12. An impedance matching circuit, comprising:

a) the impedance matching module according to claim 1;

b) further additional reactances, e.g., capacitors and/or coils; and c) a control circuit, d) wherein the semiconductor switching elements of the impedance matching module are configured to be controlled by the control circuit.

13. The impedance matching circuit according to claim 12, wherein the further additional reactances are configured to be connected and disconnected via the semiconductor switching elements and are planar.

14. A plasma process supply system having a high frequency (HF) power supply for providing an HF power signal and the impedance matching circuit according to claim 12, wherein the impedance matching circuit is electrically connected to the HF power supply and is configured to be connected to a plasma process assembly.

15. A plasma process system having the plasma process supply system according to claim 14 and a plasma process assembly, wherein the plasma process assembly is connected to the plasma process supply system and the plasma process supply system is configured to supply the plasma process assembly with power of an HF power signal.

* * * * *